(12) United States Patent
Max et al.

(10) Patent No.: US 8,239,434 B2
(45) Date of Patent: Aug. 7, 2012

(54) SYSTEM, METHOD, AND APPARATUS FOR DISTORTION ANALYSIS

(75) Inventors: Solomon Max, New York, NY (US); Christopher Joel Hannaford, Norwood, MA (US)

(73) Assignee: LTX Corporation, Norwood, MA (US)

( * ) Notice: Subject to any disclaimer, the term of this patent is extended or adjusted under 35 U.S.C. 154(b) by 1063 days.

(21) Appl. No.: 12/170,334

(22) Filed: Jul. 9, 2008

(65) Prior Publication Data

US 2009/0063071 A1 Mar. 5, 2009

Related U.S. Application Data

(60) Provisional application No. 60/948,577, filed on Jul. 9, 2007.

(51) Int. Cl.
G06F 1/02 (2006.01)

(52) U.S. Cl. ............................................. 708/271

(58) Field of Classification Search ............... None
See application file for complete search history.

(56) References Cited

U.S. PATENT DOCUMENTS

| | | | |
|---|---|---|---|
| 5,436,600 A | 7/1995 | Van Heteren | |
| 5,687,735 A | 11/1997 | Forbes | |
| 5,784,413 A | 7/1998 | Chen | |
| 5,898,325 A * | 4/1999 | Crook et al. .................. 327/105 |
| 6,236,267 B1 | 5/2001 | Anzil | |
| 6,744,261 B2 | 6/2004 | Yamanaka | |
| 6,825,729 B2 | 11/2004 | Splett | |
| 6,867,642 B1 | 3/2005 | Maqueira | |
| 6,924,711 B2 | 8/2005 | Liu | |
| 7,103,622 B1 * | 9/2006 | Tucholski ..................... 708/276 |
| 7,119,553 B2 | 10/2006 | Yang | |
| 7,295,019 B2 | 11/2007 | Yang | |
| 7,388,497 B1 | 6/2008 | Corbett | |
| 2004/0260506 A1 | 12/2004 | Jones | |
| 2005/0063553 A1 | 3/2005 | Ozawa | |
| 2005/0129139 A1 | 6/2005 | Jones | |
| 2007/0096759 A1 * | 5/2007 | Weinraub ..................... 324/763 |
| 2007/0192391 A1 * | 8/2007 | McEwan ...................... 708/271 |
| 2007/0194986 A1 | 8/2007 | Dulmovits, Jr. | |
| 2007/0253561 A1 | 11/2007 | Williams | |
| 2008/0063090 A1 | 3/2008 | Smiley | |
| 2009/0033375 A1 * | 2/2009 | Max et al. ..................... 327/106 |
| 2010/0036455 A1 | 2/2010 | Sanders | |
| 2011/0043328 A1 | 2/2011 | Bassali | |
| 2011/0193547 A1 * | 8/2011 | Max et al. .................. 324/76.19 |
| 2011/0227767 A1 * | 9/2011 | O'Brien ....................... 341/118 |

* cited by examiner

*Primary Examiner* — David H Malzahn
(74) *Attorney, Agent, or Firm* — Holland Knight, LLP; Brian J. Colandreo, Esq.; Mark H. Whittenberger, Esq.

(57) ABSTRACT

A system, method, and apparatus for distortion analysis is provided. A method in accordance with at least one embodiment of the present disclosure may include receiving a clock frequency at a direct digital synthesizer (DDS) and generating at least one stream of phase numbers via said DDS. The method may further include generating a digital sine wave using, at least in part, said clock frequency and said at least one stream of phase numbers. Of course, additional implementations are also within the scope of the present disclosure.

17 Claims, 4 Drawing Sheets

SYSTEM, METHOD, AND APPARATUS FOR DISTORTION ANALYSIS

CROSS REFERENCE TO RELATED APPLICATIONS

The subject application is related to U.S. Provisional Patent Application Ser. No. 60/948,577 entitled, System and Method for Distortion Analysis, filed Jul. 9, 2007, which is hereby incorporated by reference in its entirety.

TECHNICAL FIELD

This disclosure relates to analyzing distortion and noise in a test signal and, more particularly, to generating a sinusoidal wave signal for use in the analysis of distortion and noise.

BACKGROUND

Direct digital synthesis is a method of producing an analog waveform-usually a sine wave—by generating a time-varying signal in digital form and then performing a digital-to-analog conversion. Because operations within a DDS device may be primarily digital, such a device may offer fast switching between output frequencies, fine frequency resolution, and operation over a broad spectrum of frequencies. With advances in design and process technology, today's DDS devices may be very compact and may draw little power.

In some cases, a DDS may be used to digitally generate signals for transmission to a circuit-under-test. These synthesizers may be configured to receive digital data words from a source device and to convert these digital signals to analog signals for transmission to the circuit-under-test.

In order to generate a sinusoidal wave a number of different methods may be used. In the past, the generation of sine waves has previously been implemented by calculating a finite length array, loading the array into a memory, cycling through the array, and applying successive values of that array to a digital-to-analog converter (DAC) input. However, the finite number of points that may be required by this technique may limit the frequencies that may be synthesized in much the same way that a discrete Fourier transform differs from a continuous Fourier transform. Moreover, in the past, the implementation of a wave generation algorithm often required the use of trigonometric look-up tables.

SUMMARY OF THE DISCLOSURE

In a first implementation, a method is provided. The method may include receiving a clock frequency at a direct digital synthesizer (DDS) and generating at least one stream of phase numbers at the DDS. The method may further include generating a digital sine wave using, at least in part, the clock frequency and the at least one stream of phase numbers.

A method consistent with the present disclosure may include one of the following features. Generating at least one stream of phase numbers using a phase accumulator associated with the DDS. The method may further include receiving the digital sine wave at a first digital-to-analog (DAC) converter and generating, at the first DAC, an analog output approximating an analog sine wave.

In various implementations, the method may include canceling at least one harmonic associated with the digital sine wave to generate a digital distortion correction output. The method may further include receiving the digital distortion correction output from the DDS at a second digital-to-analog converter (DAC) and generating an analog distortion correction output. The method may further include combining the analog output and the analog distortion correction output to generate a composite output for transmission to a circuit-under-test.

In another implementation, an apparatus including distortion analysis circuitry is provided. The distortion analysis circuitry may be configured to receive a clock frequency at a DDS. In some implementations the distortion analysis circuitry may be further configured to generate at least one stream of phase numbers at the DDS and to generate a digital sine wave using, at least in part, the clock frequency and the at least one stream of phase numbers.

An apparatus consistent with the present disclosure may include at least one of the following features. In some implementations a stream of phase numbers may be generated by a phase accumulator associated with the DDS. The distortion analysis circuitry may be further configured to receive the digital sine wave at a first digital-to-analog (DAC) converter. The first DAC may be configured to generate an analog output approximating an analog sine wave.

In various implementations, the distortion analysis circuitry may be further configured to cancel at least one harmonic associated with the digital sine wave to generate a digital distortion correction output. The distortion analysis circuitry may be further configured to receive the digital distortion correction output from the DDS at a second digital-to-analog converter (DAC) and to generate an analog distortion correction output. In some implementations, the distortion analysis circuitry may be further configured to combine the analog output and the analog distortion correction output to generate a composite output for transmission to a circuit-under-test.

In another implementation, a distortion analysis system is provided. The distortion analysis system may include phase accumulator circuitry configured to generate at least one stream of phase numbers and a direct digital synthesizer (DDS) configured to receive a clock frequency. The DDS may be configured to generate a digital sine wave using, at least in part, the clock frequency and the at least one stream of phase numbers. The distortion analysis system may further include differential amplifier circuitry configured to receive an output signal from circuitry under test and an input signal to the circuitry under test. The differential amplifier circuitry may be configured to generate a differential amplifier output.

In some implementations, the distortion analysis system may also include a first digital-to-analog (DAC) converter configured to receive said digital sine wave. The first DAC may be configured to generate an analog output approximating an analog sine wave.

A system consistent with the present disclosure may include a DDS configured to cancel at least one harmonic associated with the digital sine wave to generate a digital distortion correction output. The digital distortion correction output may be provided to a second digital-to-analog converter (DAC) configured to receive the digital distortion correction output from the DDS and to generate a distortion correction output. In some implementations, the analog output and the distortion correction output may be combined to generate a composite output for transmission to a circuit-under-test.

The details of one or more implementations are set forth in the accompanying drawings and the description below. Other features and advantages will become apparent from the description, the drawings, and the claims.

DETAILED DESCRIPTION OF THE DISCLOSURE

Generally, the present disclosure relates to a system, method and apparatus for distortion analysis. In accordance with at least one implementation a direct digital synthesizer (DDS) may be used to generate sinusoidal waveforms to a circuit-under-test (CUT) in real-time, in some cases allowing for the generation of a new sinusoidal waveform data point once every clock cycle. Some of the implementations described herein utilize a 192 KHz clock, however other clock rates are also within the scope of the present disclosure.

As used in any embodiment described herein, the term "circuitry" may comprise, for example, singly or in any combination, hardwired circuitry, programmable circuitry, state machine circuitry, and/or firmware that stores instructions executed by programmable circuitry. It should be understood at the outset that any of the operations and/or operative components described in any embodiment or implementation herein may be implemented in software, firmware, hardwired circuitry and/or any combination thereof.

Figure 1:
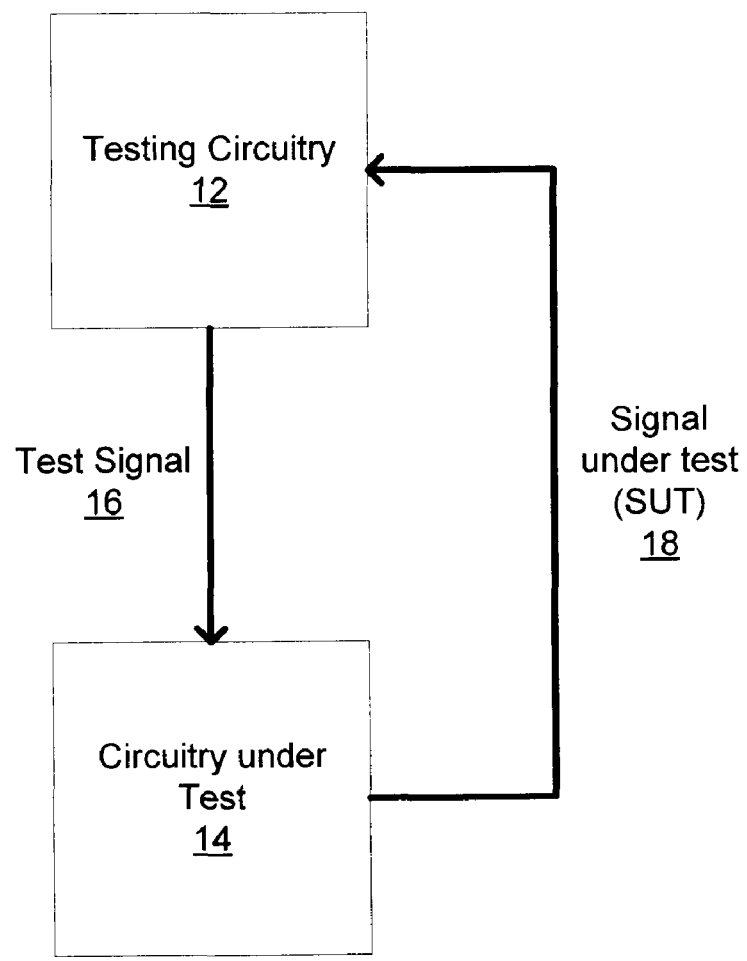
FIG. 1 is a block diagram of a system in accordance with an exemplary embodiment of the present disclosure.

Referring to FIG. 1, there is shown a system 10 including testing circuitry 12 for measuring the distortion imparted by circuitry under test 14. Testing circuitry 12 may include a signal generator (not shown) that may be configured to apply a test signal 16 to circuitry under test 14 (CUT). The resulting output signal (i.e., signal under test 18) generated by circuitry under test 14 may be provided to an input port/terminal (not shown) of testing circuitry 12. Since test signal 16 may typically be a distortion-free signal, the distortion imparted by circuitry under test 14 may be determined by comparing test signal 16 and signal under test 18.

As discussed above, circuitry under test 14 may be driven by test signal 16. Examples of test signal 16 may include, but are not limited to, an 8 VAC $_{peak-to-peak}$ 1 kHz sinusoidal signal. The amplitude, frequency, and type of test signal (e.g., test signal 16) applied to circuitry under test 14 may vary depending on the type of circuitry being tested (e.g., circuitry under test 14). For example, for some circuit types, a square wave signal or triangle wave signal may be applied to circuitry under test 14. In some implementations, a sinusoidal wave signal may be provided to circuitry under test 14 as is discussed in further detail below.

Figure 2:
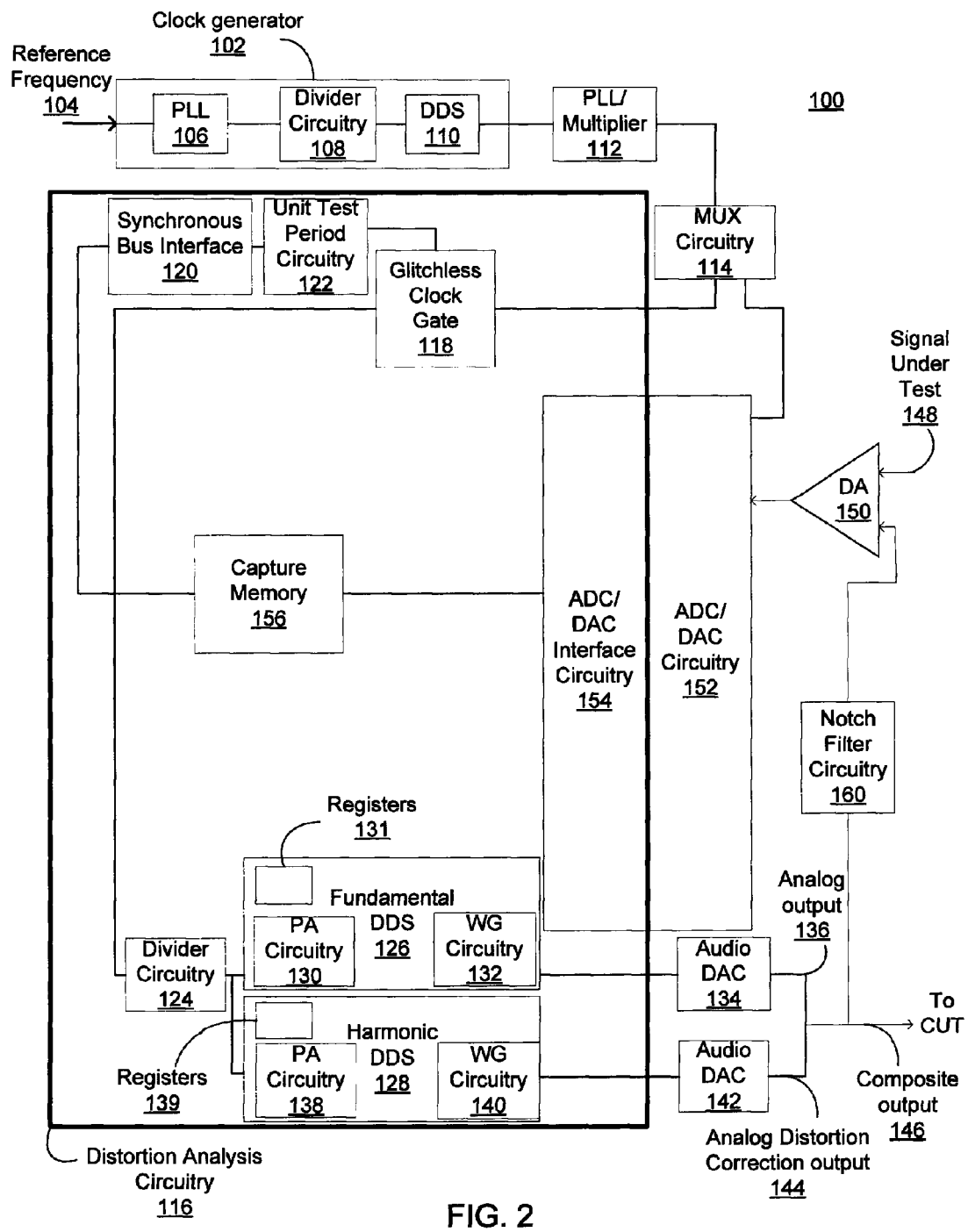
FIG. 2 is a diagrammatic representation of testing circuitry including distortion analysis circuitry in accordance with another exemplary embodiment of the present disclosure.

Referring also to FIG. 2, an embodiment showing additional detail of testing circuitry 100 is shown. Testing circuitry 100 may include a system clock generator 102 configured to receive a system reference frequency 104. In some embodiments reference frequency 104 may be a 10 MHz frequency, however, numerous other frequencies may be used without departing from the scope of the present disclosure.

System clock generator 102 may be configured to receive system reference frequency 104 at phase locked loop (PLL) 106. PLL 106 may generate an output signal dependent upon both the frequency and phase of system reference frequency 104. This output signal may be received by divider circuitry 108 before entering direct digital synthesizer (DDS) 110. DDS 110 may be configured to receive the output from divider circuitry and to generate an arbitrary waveform from this fixed frequency source. This waveform may be applied to PLL/multiplier 112. DDS 110 may include a number of different components, including, but not limited to, RAM, oscillator circuitry, counter circuitry, ADCs, DACs, etc.

PLL/Multiplier 112 may be configured to receive a signal of one frequency range (e.g., 12.5 MHz-25-MHz) and to increase the frequency by a given factor. For example, in this case, a 100 MHz-200 MHz frequency range may be generated if a multiplier of 8 is utilized. The output of PLL/Multiplier 112 may be provided to multiplexer (MUX) circuitry 114, which may be configured to provided the clock frequency to distortion analysis circuitry 116.

As shown in FIG. 2, distortion analysis circuitry 116 may include a number of different components and may be implemented using a number of different implementations. For example, in some implementations, distortion analysis circuitry 116 may be implemented in a field programmable gate array (FPGA), System on a Chip (SoC), an application specific integrated circuit (ASIC), and/or any other type of semiconductor device.

Distortion analysis circuitry 116 may be configured to receive the clock frequency output from MUX circuitry 114 at glitchless clock gate 118. Glitchless clock gate 118 may also be configured to receive a signal from synchronous bus interface 120 via logic 122 and to generate an output, which may be received by divider circuitry 124. Divider circuitry 124 may be configured to receive an input signal having a particular frequency (e.g. 122.88 MHz) and to generate an output frequency having a fraction of the input frequency (e.g. 12.288 MHz). This adjusted frequency signal may then be provided to both the fundamental direct digital synthesizer (DDS) 126 and the harmonic DDS 128, which are each discussed in more detail below.

Figure 3:
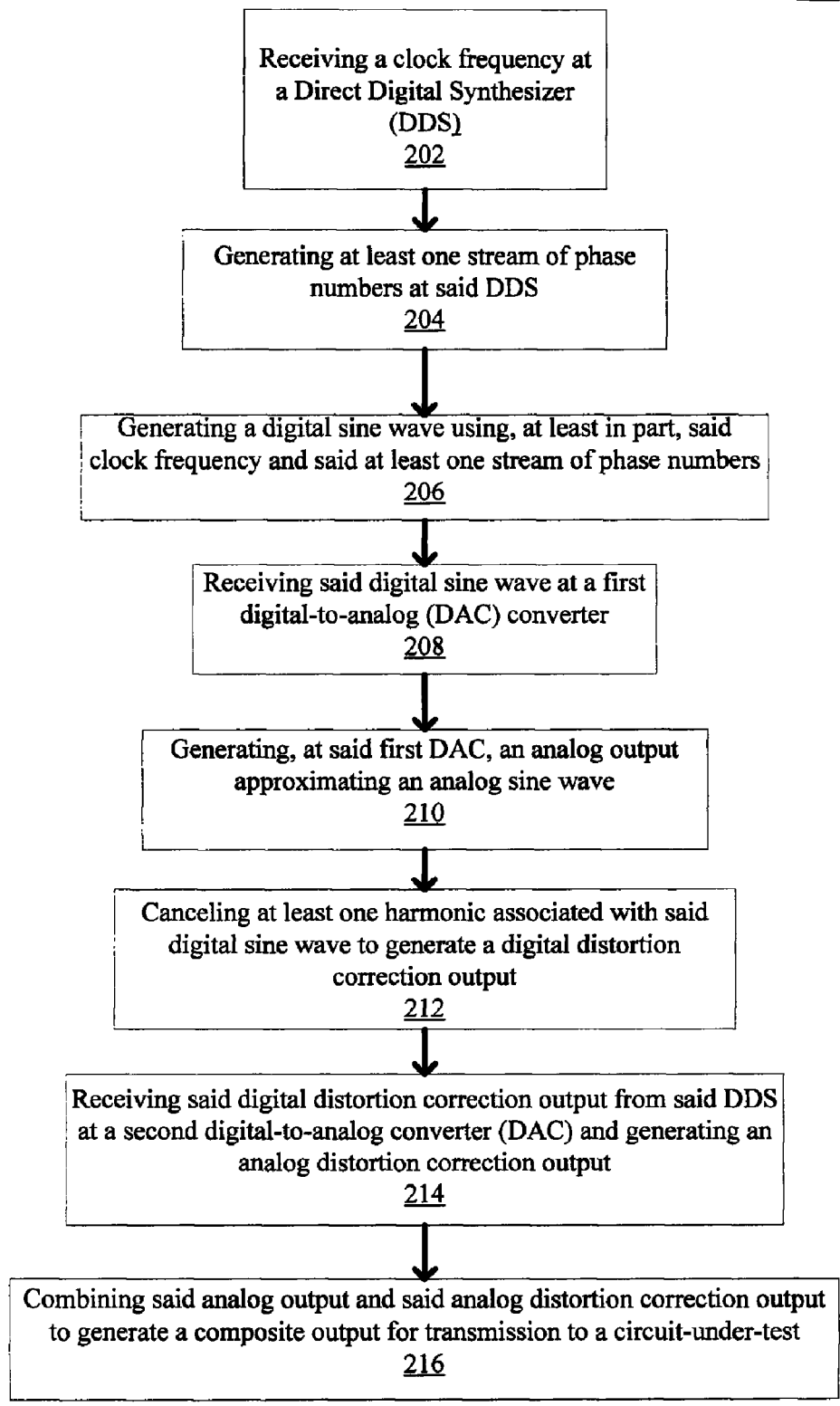
FIG. 3 is a flowchart of a method executed by the distortion analysis system of FIG. 1.

Referring also now to FIG. 3, fundamental DDS 126 may include a variety of components, including, but not limited to, phase accumulator (PA) circuitry 130 and wave generation circuitry 132. Fundamental DDS 126 may be configured to provide adjustable frequency, phase, amplitude and offset capabilities. In some implementations, PA circuitry 130 may be configured to generate a stream of phase numbers (204) for use by wave generation circuitry 132. Wave generation circuitry 132 may be configured to receive a clock frequency (202) at fundamental DDS 126 and to generate a digital sine wave using the adjusted clock frequency signal and the stream of phase numbers generated by PA circuitry 130 (206).

Wave generation circuitry 132 and 140 (described below) may be configured to implement a variety of different algorithms. Some of these algorithms may include, but are not limited to, Coordinate Rotation Digital Computer (CORDIC), sine-phase difference, modified Sunderland, Nicholas, and Taylor Series approximation algorithms. Of course, numerous other sine wave generation techniques may be employed without departing from the scope of the present disclosure.

As an example, using the values described above, the 12.288 MHz clock frequency signal may be used to drive wave generation circuitry 132 to produce a new digital serial word at the rate of 192 KS/s. The phase and amplitude values may be selected.

Wave generation circuitry 132 may provide the digital serial data stream to audio digital-to-analog (DAC) converter 134. DAC 134 may then receive the digital sine wave (208) and may be configured to translate the serial data stream, e.g., digital sine wave, into an analog output waveform 136 that approximates a pure analog sine wave (210).

Specifically, wave generation circuitry 132 may be configured to implement the following equation:

$$N = A^* \sin(\text{Angle}^* I + \text{Phase}) \quad \text{Equation (1)}$$

In Equation 1, A refers to the amplitude of the sine wave that is programmed, Angle and Phase may be programmed values, and I is a number that may begin at 0 and may be incremented by 1 at every clock cycle of the 192 KHz clock.

Similarly, harmonic DDS 128 may also include PA circuitry 138 and wave generation circuitry 140. Harmonic DDS 128 may be configured to cancel at least one harmonic associated with the digital sine wave to generate a digital distortion correction output (212). The digital distortion correction output may be provided to second DAC 142 to generate an analog distortion correction output 144 (214). Analog distortion correction output 144 may be used to correct for distortion components in DAC 134. The analog output waveform generated by DAC 134 may be combined with the analog distortion correction output to generate a composite output 146 for transmission to a circuit-under-test (216) such as that shown in FIG. 1. In some implementations, harmonic DDS 128 may be configured to cancel up to 8 harmonics generated by first audio DAC 134 by analyzing the inherent non-linearities in first audio DAC 134.

In some implementations, composite output 146 may be used to drive an ADC circuit under test CUT, such as CUT 14 shown in FIG. 1, to test the CUT. Alternatively, composite output 146 may be used to null a DAC CUT output to generate a null which may be used to evaluate the CUT performance.

In one implementation, composite output waveform 146 may be provided to notch filter circuitry 160. Notch filter circuitry 160 may be configured to receive the composite output waveform 146 and to filter composite output 146 to generate a filtered composite output. Filtered composite output may then be provided to differential amplifier 150, which may amplify a difference between the filtered composite output waveform and a signal from the circuit-under-test to generate an amplified analog signal. Amplified analog signal may be converted to an amplified digital signal using ADC/DAC circuitry 152. The amplified digital signal may be stored in capture memory 156.

Once amplitude and phase information has been determined a calibration sequence may be generated for notch filter circuitry 160. The calibration sequence may be configured to calculate at least one of a harmonic amplitude and a harmonic phase corresponding to a measured unknown harmonic signal. In this way, frequencies may be generated by audio DAC 134 at the various expected harmonics and the phase and amplitude response of notch filter circuitry 160 may be measured. Calibration factors may be generated and used to calculate what harmonic amplitude and phase is present when an unknown harmonic is measured. A compensating distortion correction signal may be generated to subtract the spurious frequency components. It should be noted that, in some instances, only the frequencies having corresponding notch filters may be tested with some of the algorithms described herein.

As shown in FIG. 2, composite output 146 and signal under test 148 may be provided to differential amplifier circuitry 150. Differential amplifier circuitry 150 may be configured to generate a differential amplifier output using composite output signal 146 and signal under test 148. The output of differential amplifier may be provided to ADC/DAC circuitry 152, which may be configured to- provide analog-to-digital-conversion and to provide a signal back to distortion analysis circuitry 116. Specifically, ADC/DAC interface circuitry 154 may receive this converted signal from ADC/DAC circuitry 152, provide any necessary conversion, and generate an output that may be received by capture memory 156. The term "memory" as described herein, may refer to semiconductor firmware memory, programmable memory, non-volatile memory, read only memory, electrically programmable memory, random access memory, flash memory, magnetic disk memory, and/or optical disk memory.

Figure 4:
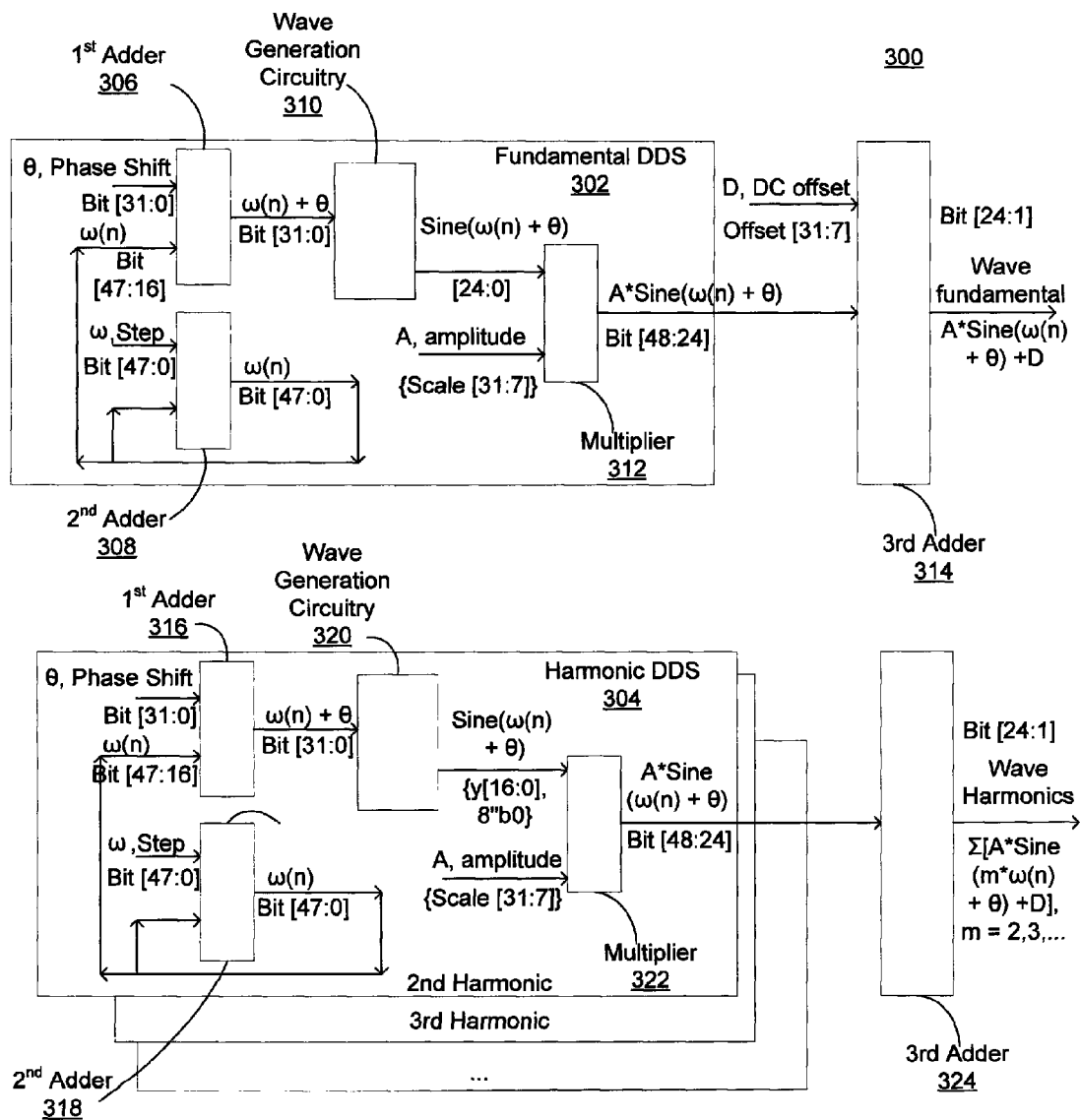
FIG. 4 is a diagrammatic representation of a fundamental and a harmonic direct digital synthesizer in accordance with yet another exemplary embodiment of the present disclosure.

Referring now to FIG. 4, another implementation 300 depicting fundamental direct digital synthesizer (DDS) 302 and harmonic DDS 304 is provided. Fundamental DDS 302 may be configured to receive numerous inputs relating to, for example, the angle, clock and the starting phase information. Of course, additional information may also be provided.

As shown in FIG. 4, first adder circuitry 306, working in conjunction with second adder circuitry 308, may be configured to receive the clock frequency ω as well as the phase shift data θ, perform an addition operation, and to provide the result to wave generation circuitry 310. wave generation circuitry 310, as described above, may then generate a digital sinusoidal waveform using this data resulting in a digital waveform of the equation Sine(ω(n)+θ). This digital waveform may then be provided to multiplier 312, which may perform a multiplication operation on the digital waveform and amplitude input A resulting in an output corresponding to the equation A*Sine(ω(n)+θ). This output may then be combined with a DC offset at third adder 314 to generate the digital sine wave or wave fundamental of the form A*Sine(ω(n)+θ)+D. This signal may then be provided to the first audio DAC 134 shown in FIG. 2 for conversion to an analog waveform.

Harmonic DDS 304 may be of a similar configuration and, as such, may also include first and second adder circuitry 316 and 318, wave generation circuitry 320, multiplier 322, and third adder 324. As discussed above, harmonic DDS 304 may be configured to generate a digital distortion correction output, which may be configured to cancel at least one harmonic generated by Fundamental DDS 302. The digital distortion correction output of harmonic DDS 304 may be provided to second audio DAC 142 to generate an analog distortion correction output. Analog output 136 from first DAC 134 and analog distortion correction output 144 from second audio DAC 142 may be combined to generate a composite output 146 for transmission to a circuit-under-test as is described in further detail above.

In accordance with at least one implementation the direct digital synthesizers described herein may include a variety of registers (e.g., registers 131 and 139 shown in FIG. 2) and other circuitry components in order to generate the sinusoidal waveforms described herein. In at least one implementation of the present disclosure the methods described herein may be implemented inside an FPGA. As such, each of the direct digital synthesizers may be controlled in part by a series of registers described in more detail in Tables 1-6.

TABLE 1

| Wave phase interval register | | | | | |
|---|---|---|---|---|---|
| Address: 0x18E, HYDRA_ACH_WAVE_INTVL_W1 | | | | | |
| Address: 0x18F, HYDRA_ACH_WAVE_INTVL_W0 | | | | | |
| 31:16 | | | 15:0 | | |
| Wave_intvl | | | | | |
| Position | Signal Name | Description | R/W | SW | HW |
| Bit [31:0] | Wave_intvl | Point at which setting ω * n to zero, e.g., phase is the initial phase shift | RW | 0x0 | 0x0 |

In accordance with some implementations, the wave phase interval register may be a 32 bit register, which may be treated as two 16 bit read/write registers for purposes of reading and writing. This register may be used to keep mathematical errors in the phase accumulator when the ω step is repeatedly added causing drift in the frequency of the signals being generated by fundamental DDS 302 and/or harmonic DDS 304. The wave phase interval register may be set to the number of master clock cycles after which the phase accumulator circuitry 138 may be back to its initial phase. This information may be utilized inside the signal generator to re-initialize the phase accumulation process. In at least one implementation, the wave phase interval register may be programmed in units of the 192 kHz sample rate. For merely exemplary purposes, two examples of what may be programmed into the wave phase interval register (assuming a clock rate of 192 kHz) are provided below.

EXAMPLE 1

To produce sinusoidal waveform of frequency 1 kHz this register may be programmed to 192. After 1 ms (192/192 kHz) the phase of the 1 kHz signal that is produced may be back to where it was initially.

EXAMPLE 2

To produce a sinusoidal waveform of frequency 1.01 kHz this register may be programmed to 19200. At the 100 ms mark (19200/192 kHz) the phase of the 1.01 kHz waveform (i.e., finishing its $101^{th}$ cycle) may be the same as it was when the signal generation process was initiated. Of course, these examples are merely intended for exemplary purposes as numerous other configurations and inputs may be used.

TABLE 2

Wave DC Offset Register

Address: 0x190, HYDRA_ACH_WAVE_DC_W1
Address: 0x191, HYDRA_ACH_WAVE_DC_W0

| 31:16 | 15:0 |
|---|---|
| bit [31:7] Wave Dc Offset | xxxx |

| Position | Signal Name | Description | R/W | SW | HW |
|---|---|---|---|---|---|
| Bit [31:16] | Wave_dc_w1 | Bit 31:16 of the DC component of the fundamental | RW | 0x0 | 0x0 |
| Bit [15:7] | Wave_dc_w0 | Bit 15:7 of the DC component of the fundamental | RW | 0x0 | 0x0 |

In some implementations, the wave DC offset register may be a 32 bit register, which may be treated to as two 16 bit read/write registers for the purposes of reading and writing. In some implementations this register may be programmed in lsb units of fundamental DAC 134. The value of the wave DC offset register may be mathematically summed into the data stream of fundamental sinewave DAC 134 prior to it reaching DAC 134. That is, in at least one implementation this register may contain the D found in the equation $Y(n)=A\cdot Sine(\omega\cdot n+\theta)+D$.

TABLE 3

Wave Sine Index Register

Address: 0x193, HYDRA_ACH_WAVE_SINE_INDEX

| 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| | | | | | | | | | | | W0 | | sine_index | | |

| Position | Signal Name | Description | R/W | SW | HW |
|---|---|---|---|---|---|
| Bit [4] | W0 | Write enable for bit 3:0 | R = 0 | 0x0 | 0x0 |
| Bits [3:0] | Sine_index | 0001: fundamental<br>0010: $2^{nd}$ harmonic<br>0011: $3^{rd}$ harmonic<br>0100: $4^{th}$ harmonic<br>0101: $5^{th}$ harmonic<br>0110: $6^{th}$ harmonic<br>0111: $7^{th}$ harmonic<br>1000: $8^{th}$ harmonic<br>1001: $9^{th}$ harmonic<br>1010: $10^{th}$ harmonic | RW | 0x0 | 0x0 |

In some implementations, the wave sine index register may be a 16 bit read/write register. This register may act as the index of the sine components, fundamental, and harmonics, in an arbitrary wave. For example, the fundamental may be in the form of $Y(n)=A\cdot Sine(\omega\cdot n+\theta)+D$. Where, A is the amplitude or scale, D is the DC offset, θ is the phase shift or phase0, ω is the angular frequency or step. Each harmonic may be in the form of $Y(n)=A\cdot Sine(m\cdot\omega\cdot n+\theta)$, m=2,3, . . . The wave sine index register may also be used as an index when addressing the angular frequency register, the phase shift register, the amplitude, and the phase interval register of each sine component.

In at least one implementation the registers described in TABLES 4-6 may be duplicated once for the fundamental tone DDS (e.g., 126) as well as once more for the harmonic tone DDS (e.g., 128). In some implementations, in order to write to or read from any of the registers of the individual DDS's this register must first be set to point to the DDS prior to using the registers described in TABLES 4-6.

TABLE 4

Wave Step Register

Address: 0x194, HYDRA_ACH_WAVE_STEP_W2
Address: 0x195, HYDRA_ACH_WAVE_STEP_W1
Address: 0x196, HYDRA_ACH_WAVE_STEP_W0

| 47:32 | 31:16 | 15:0 |
|---|---|---|
| | Wave_step | |

| Position | Signal Name | Description | R/W | SW | HW |
|---|---|---|---|---|---|
| Bit [47:32] | Wave_step_w2 | Bit 48:32 of the angular frequency | RW | 0x0 | 0x0 |
| Bit [31:16] | Wave_step_w1 | Bit 31:16 of the angular frequency | RW | 0x0 | 0x0 |
| Bit [15:0] | Wave_step_w0 | Bit 15:0 of the angular frequency | RW | 0x0 | 0x0 |

In some implementations, the wave step register may be a 48 bit register, which may be treated as three 16 bit read/write registers for purposes of reading and writing. In at least one implementation, on each 192 kHz clock cycle the contents of this wave step register, which represents an angle between 0 and Pi may be added to the number already present in phase accumulator circuitry 138 to form new phase angle. In at least one implementation if the resultant phase angle value would be greater than Pi then as the step value is being added a value of two Pi may also be subtracted out. (The net effect being that only phase angle values between −Pi and +Pi may be produced by the phase accumulator stage). It should be noted that numerous alternate algorithms for operating the phase accumulator circuitry 138 are also possible.

In some implementations the wave step register may include a binary point located four bits from the left between Bit[44] and Bit[43] of the register such that an angle of one radian (1.000) would be represented as 0x1000_0000_0000 with the lsb of the 48 bit register representing an angle of $2^{(-44)}$ radians.

TABLE 5

Wave Phase Shift Register

Address: 0x198, HYDRA_ACH_WAVE_PHASE_W1
Address: 0x199, HYDRA_ACH_WAVE_PHASE_W0

| 31:16 | | | 15:0 | | |
|---|---|---|---|---|---|
| Wave_phase | | | | | |
| Position | Signal Name | Description | R/W | SW | HW |
| Bit [31:16] | Wave_phase_w1 | Bit 31:16 of the phase shift | RW | 0x0 | 0x0 |
| Bit [15:0] | Wave_phase_w0 | Bit 15:0 of the phase shift | RW | 0x0 | 0x0 |

In some implementations, the wave phase shift register may be a 32 bit register, which may be treated as two 16 bit read/write registers for purposes of reading and writing. In some implementations the value of the wave phase shift register may be added to the upper bits of the value of phase accumulator circuitry 138 to form a new phase shifted waveform angle. In at least one implementation, the range of this phase shifted waveform angle may take on values between +Pi and −Pi. In some implementations this 32 bit shifted waveform angle value may have a binary point four places from the left and hold numbers in a two's compliment form between 0x3243F6A8 (+Pi) and 0xCDBC0958 (−Pi). Relating this to the above description this shifted phase angle represents the term (ω·n+θ).

Wave generation circuitry 132 and 140 may be used to either calculate or lookup the sin( ) value corresponding to the phase shifted angle value. This may be done in any number of ways ranging from a brute force lookup table (of depth $2^{32}$) to a nearly all math CORDIC technique. In at least one implementation, the sine( ) values of the phase shifted angle Sine (ω·n+θ) [or Sine (m·ω·n+θ), m=2,3, . . . for harmonic wave generation circuitry 140] may be computed using the CORDIC technique.

TABLE 6

Wave Scale Register

Address: 0x19A, HYDRA_ACH_WAVE_SCALE_W1
Address: 0x19B, HYDRA_ACH_WAVE_SCALE_W0

| 31:16 | | | 15:0 | | |
|---|---|---|---|---|---|
| Bit [31:7] Wave_scale | | | Xxxx | | |
| Position | Signal Name | Description | R/W | SW | HW |
| Bit [31:16] | Wave_scale_w1 | Bit 31:16 of the amplitude | RW | 0x0 | 0x0 |

TABLE 6-continued

Wave Scale Register

| Bit [15:7] | Wave_scale_w0 | Bit 15:7 of the amplitude | RW | 0x0 | 0x0 |
|---|---|---|---|---|---|

In some implementations, the wave scale register may be a 32 bit register, which may be treated as two 16 bit read/write registers for purposes of reading and writing. In some implementations this register may be used to scale the amplitude of the Sine (ω·n+θ) term to produce either the A·Sine (ω·n+θ) value [or the A·Sine (m·ω·n+θ), m=2,3, . . . values for each of the harmonic cancelation tones produced].

In at least one implementation, after each of the Sine wave data values has been calculated the DC offset may be added to the scaled fundamental test tone term A·Sine (ω·n+θ) +D using 3rd adder 314 shown in FIG. 4. The scaled harmonic cancelation values A·Sine (ω·n+θ), m=2,3, . . . may be summed together using 3rd adder 324 into a multi-tone waveform data stream in which each of the sub-component of the multi-tone maybe independently controlled. It should be noted that in the composite output waveform 146 the DC offset may be added to fundamental analog output 136 or the harmonic correction analog output 144.

Embodiments of the implementations described above may be implemented in a computer program that may be stored on a storage medium having instructions to program a system to perform the methods. The storage medium may include, but is not limited to, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of media suitable for storing electronic instructions. Other embodiments may be implemented as software modules executed by a programmable control device.

A number of implementations have been described. Nevertheless, it will be understood that various modifications may be made. Accordingly, other implementations are within the scope of the following claims.

What is Claimed is:

1. A method comprising:
   receiving a clock frequency at a direct digital synthesizer (DDS);
   generating at least one stream of phase numbers at said DDS;
   generating a digital sine wave using, at least in part, said clock frequency and said at least one stream of phase numbers; and
   canceling at least one harmonic associated with said digital sine wave to generate a digital distortion correction output.

2. The method of claim 1 wherein said at least one stream of phase numbers is generated by a phase accumulator associated with said DDS.

3. The method of claim 1 further comprising receiving said digital sine wave at a first digital-to-analog (DAC) converter.

4. The method of claim 3 further comprising generating, at said first DAC, an analog output approximating an analog sine wave.

5. The method of claim 1 further comprising receiving said digital distortion correction output from said DDS at a second digital-to-analog converter (DAC) and generating an analog distortion correction output.

6. The method of claim 5 further comprising combining an analog output and said analog distortion correction output to generate a composite output for transmission to a circuit-under-test.

7. An apparatus comprising:
distortion analysis circuitry configured to receive a clock frequency at a direct digital synthesizer (DDS) included within the distortion analysis circuitry, said distortion analysis circuitry further configured to generate at least one stream of phase numbers at said DDS, said DDS further configured to generate a digital sine wave using, at least in part, said clock frequency and said at least one stream of phase numbers, wherein said distortion analysis circuitry is further configured to cancel at least one harmonic associated with said digital sine wave to generate a digital distortion correction output.

8. The apparatus according to claim 7 wherein said at least one stream of phase numbers is generated by a phase accumulator associated with said DDS.

9. The apparatus according to claim 7 wherein said distortion analysis circuitry is further configured to receive said digital sine wave at a first digital-to-analog converter (DAC).

10. The apparatus according to claim 9 wherein said distortion analysis circuitry is further configured to generate, at said first DAC, an analog output approximating an analog sine wave.

11. The apparatus according to claim 9 wherein said distortion analysis circuitry is further configured to receive said digital distortion correction output from said DDS at a second digital-to-analog converter (DAC) and to generate an analog distortion correction output.

12. The apparatus according to claim 11 wherein said distortion analysis circuitry is further configured to combine said analog output and said analog distortion correction output to generate a composite output for transmission to a circuit-under-test.

13. A distortion analysis system comprising:
phase accumulator circuitry configured to generate at least one stream of numbers;
a direct digital synthesizer (DDS) included within a distortion analysis circuitry, the DDS being configured to receive a clock frequency, said DDS being configured to generate a digital sine wave using, at least in part, said clock frequency and said at least one stream of phase numbers, wherein said DDS is further configured to cancel at least one harmonic associated with said digital sine wave to generate a digital distortion correction output; and
differential amplifier circuitry, included within the distortion analysis circuitry, the differential amplifier circuitry being configured to receive an output signal from circuitry under test and an input signal to the circuitry under test, said differential amplifier circuitry is configured to generate a differential amplifier output.

14. The distortion analysis system according to claim 13 further comprising a first digital-to-analog converter (DAC) configured to receive said digital sine wave.

15. The distortion analysis system according to claim 14 wherein said first DAC is configured to generate an analog output approximating an analog sine wave.

16. The distortion analysis system according to claim 14 further comprising a second digital-to-analog converter (DAC) configured to receive said digital distortion correction output from said DDS and to generate a distortion correction output.

17. The distortion analysis system according to claim 16 wherein said analog output and said distortion correction output are combined to generate a composite output for transmission to a circuit-under-test.

* * * * *